United States Patent
Ganguli et al.

(10) Patent No.: US 9,269,584 B2
(45) Date of Patent: Feb. 23, 2016

(54) N-METAL FILM DEPOSITION WITH INITIATION LAYER

(75) Inventors: Seshadri Ganguli, Sunnyvale, CA (US); Xinliang Lu, Fremont, CA (US); Atif Noori, Saratoga, CA (US); Maitreyee Mahajani, Saratoga, CA (US); Shih Chung Chen, Cupertino, CA (US); Mei Chang, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 205 days.

(21) Appl. No.: 13/525,610

(22) Filed: Jun. 18, 2012

(65) Prior Publication Data

US 2012/0322262 A1 Dec. 20, 2012

Related U.S. Application Data

(60) Provisional application No. 61/498,932, filed on Jun. 20, 2011.

(51) Int. Cl.
| | |
|---|---|
| *H01L 21/44* | (2006.01) |
| *H01L 21/28* | (2006.01) |
| *H01L 29/49* | (2006.01) |
| *H01L 21/02* | (2006.01) |

(52) U.S. Cl.
CPC ...... *H01L 21/28088* (2013.01); *H01L 29/4966* (2013.01); *H01L 21/02697* (2013.01)

(58) Field of Classification Search
CPC ................................................. H01L 21/02697
USPC ....................................... 438/656; 427/249.17
See application file for complete search history.

(56) References Cited

U.S. PATENT DOCUMENTS

| | | | |
|---|---|---|---|
| 5,055,246 A | 10/1991 | Jalby et al. | |
| 6,229,211 B1* | 5/2001 | Kawanoue et al. | 257/751 |
| 6,511,609 B2 | 1/2003 | Jan et al. | |
| 7,183,208 B2 | 2/2007 | Doan et al. | |
| 7,220,312 B2 | 5/2007 | Doan et al. | |
| 2003/0073308 A1* | 4/2003 | Mercaldi | 438/680 |
| 2006/0211224 A1 | 9/2006 | Matsuda | |
| 2006/0249847 A1 | 11/2006 | Eriksen et al. | |
| 2007/0057305 A1* | 3/2007 | Oates et al. | 257/301 |
| 2007/0099420 A1* | 5/2007 | Dominguez et al. | 438/681 |
| 2007/0148350 A1* | 6/2007 | Rahtu et al. | 427/249.17 |
| 2007/0238288 A1* | 10/2007 | Suzuki | 438/652 |
| 2007/0251445 A1* | 11/2007 | Ishizaka | 117/92 |
| 2008/0102204 A1 | 5/2008 | Elers | |
| 2008/0113110 A1* | 5/2008 | Elers et al. | 427/577 |
| 2008/0139869 A1* | 6/2008 | Wilson et al. | 588/299 |
| 2010/0193955 A1* | 8/2010 | Milligan et al. | 257/751 |

OTHER PUBLICATIONS

PCT International Search Report and Written Opinion in PCT/US2012/043278, mailed Jan. 21, 2013, 11 pgs.

* cited by examiner

*Primary Examiner* — Kimberly Rizkallah
*Assistant Examiner* — Maria Ligai
(74) *Attorney, Agent, or Firm* — Servilla Whitney LLC

(57) ABSTRACT

Provided are methods of depositing N-Metals onto a substrate. Methods include first depositing an initiation layer. The initiation layer may comprise or consist of cobalt, tantalum, nickel, titanium or TaAlC. These initiation layers can be used to deposit $TaC_x$.

20 Claims, 3 Drawing Sheets

N-METAL FILM DEPOSITION WITH INITIATION LAYER

CROSS-REFERENCE TO RELATED APPLICATIONS

The application claims the benefit under 35 U.S.C. 119(e) of U.S. Provisional Application No. 61/498,932, filed Jun. 20, 2011.

FIELD

The present invention relates generally to a method of forming a metal gate in semiconductor devices. More particularly, the disclosed method relates to a method of depositing the N-Metal film $TaC_x$ onto a gate insulating substrate.

BACKGROUND

Integrated circuit technology continues to rapidly advance, with many circuit technologies being implemented using semiconductor fabrication processes. A variety of electrically conducting material is available for implementing the layers in the gates of semiconductor integrated circuits.

As is well known in the art, a silicon oxide film has been mainly used as a material of a gate insulating film in MOSFETs, and a polysilicon film has been used as a material of the gate. However, as the integration level of the semiconductor devices becomes higher, it is required that the line width of the gate and the thickness of the gate insulating film be reduced. In the case where a silicon oxide film is used as the material of the gate insulating film, if the thickness of the gate insulating film is too thin, the insulating characteristic is not stable, as the leakage current due to a direct tunneling through the gate insulating film becomes greater. Recently there has been an effort to use a high dielectric constant material having a relatively higher dielectric constant than a silicon oxide film as the material of the gate insulating film. Also, in order to minimize the polysilicon gate depletion effect, there has been an effort to use a metal gate instead of the polysilicon gate.

However, N-Metal films such as $TaC_x$ and $TaSi_x$ cannot be easily deposited directly onto several substrates commonly used for gate insulating layers, including $HfO_2$ or TiN. Before the present invention, deposition of $TaC_x$ on any substrate was a very slow process, and it was very difficult to obtain any $TaC_x$ deposition.

Therefore, there is a need to provide methods that allow for suitable N-Metal film deposition onto gate insulation substrates.

SUMMARY OF THE INVENTION

Provided are methods of depositing N-Metals onto a substrate. Methods include first depositing an initiation layer. The initiation layer may comprise cobalt, tantalum, nickel, titanium or TaAlC. These initiation layers can be used to deposit $TaC_x$.

A first aspect relates to a method of depositing $TaC_x$ onto a substrate, the method comprising depositing an initiation layer comprising a metal or metal alloy selected from the group consisting of nickel, cobalt, tantalum, titanium and TaAlC onto a substrate; depositing a layer of $TaC_x$ onto the initiation layer, wherein x has a value having a range of about 0.4 to about 1.5. In a further embodiment, the initiation layer consists essentially of TaAlC, nickel, cobalt, tantalum, or titanium.

A second aspect of the invention relates to a method of depositing $TaC_x$ onto a substrate, the method comprising placing the substrate into a process chamber; depositing an initiation layer comprising a metal or metal alloy selected from the group consisting of TaAlC, nickel, cobalt, tantalum and titanium onto the substrate and sequentially exposing a surface of the substrate containing the initiation layer to a $TaCl_5$ gas and a hydrocarbon gas to form a layer of $TaC_x$ on the initiation layer, wherein x has a value having a range of about 0.4 to about 1.5. In a further embodiment, the initiation layer consists essentially of TaAlC, nickel, cobalt, tantalum, or titanium.

Another aspect of the invention relates to a method of depositing $TaC_x$ onto a substrate, the method comprising depositing an initiation layer comprising a metal or metal alloy selected from the group consisting of TaAlC, nickel, cobalt, tantalum and titanium onto the substrate; sequentially exposing a surface of the substrate to a first reactant gas containing a tantalum halide and a second reactant gas comprising a hydrocarbon to form $TaC_x$ on the initiation layer, wherein x has a value having a range of about 0.4 to about 1.5; and repeating sequentially exposure of the substrate surface to the first reactant gas and second reactant gas. In a further embodiment, the initiation layer consists essentially of TaAlC, nickel, cobalt, tantalum, or titanium.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to offer equally effective embodiments.

DETAILED DESCRIPTION

Figure 1:
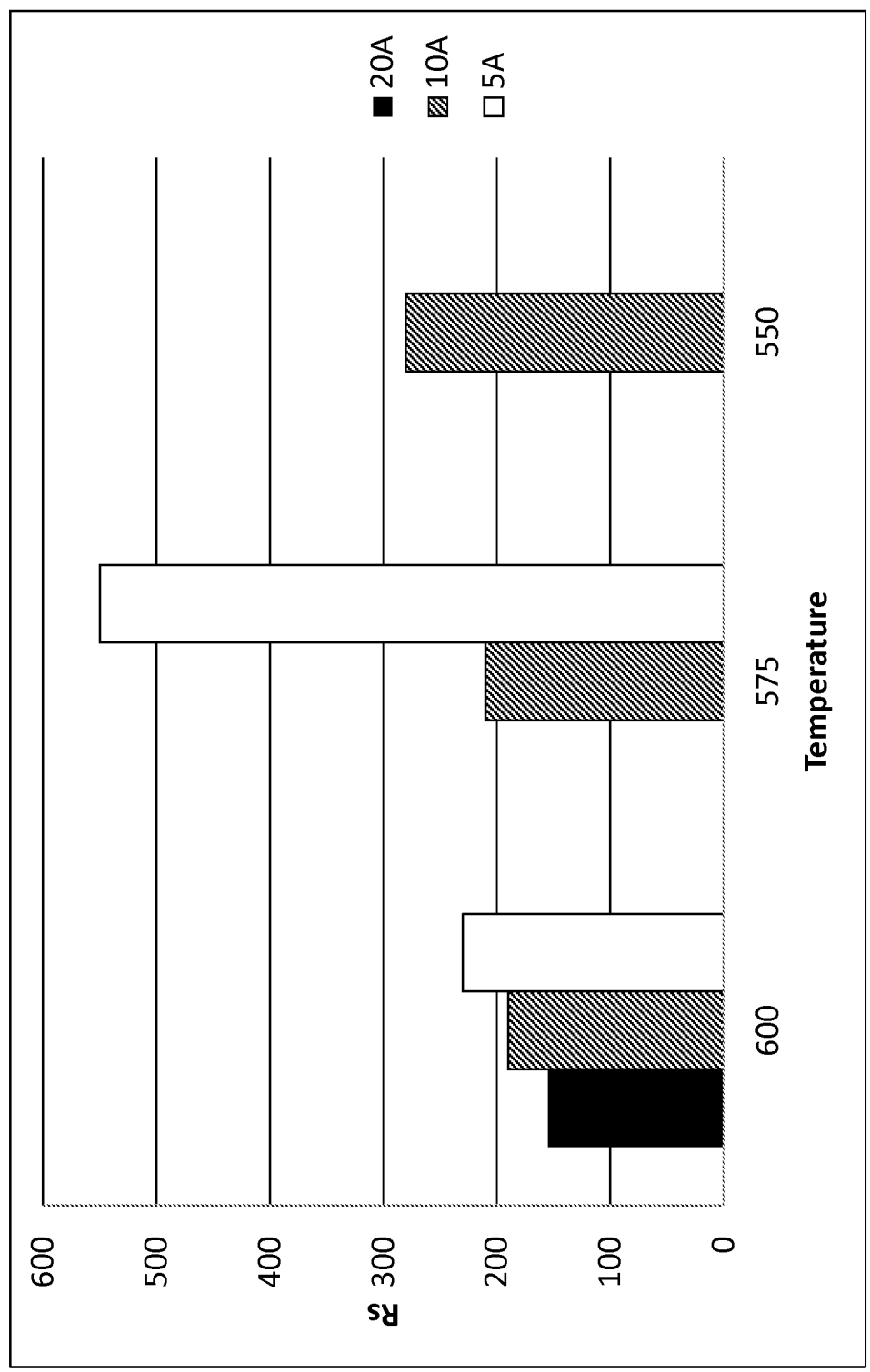
FIG. 1 is a graph showing the sheet resistivity across a cobalt initiation layer of 5, 10 and 20 Angstroms each at temperatures of 600°, 575° and 550° C.

Before describing several exemplary embodiments of the invention, it is to be understood that the invention is not limited to the details of construction or process steps set forth in the following description. The invention is capable of other embodiments and of being practiced or being carried out in various ways. These illustrations are intended as examples only and are not to be construed as limiting the disclosed structure to any particular stereochemistry.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Embodiments of the present invention pertain to methods of depositing a metal layer on a substrate. Certain embodiments described herein particularly pertain to deposition of an initiation layer to facilitate deposition of the metal layer. Furthermore, embodiments of the present invention relate to the deposition of $TaC_x$. The value of x generally varies in a range of about 0.4 to about 1.

As used herein, "initiation layer" is used synonymously with "catalyst layer". These terms are used to describe a deposition layer that is deposited prior to and to aid in the deposition of a desired metal layer, such as TaC. While not wishing to be bound by a particular theory, according to one or more embodiments, the initiation layer or nucleation layer catalytically promotes the growth of the desired metal layer when such growth was not previously possible in the absence of the initiation layer or nucleation layer.

As described in the Background section, $TaC_x$ is difficult, if not impossible, to deposit directly onto a substrate. It has been surprisingly discovered that an initiation layer can be used to facilitate deposition of a $TaC_x$ layer. In particular, an initiation layer comprising a metal or metal alloy selected from Co, Ta, Ni and/or Ti are very effective. In a further embodiment, the initiation layer consists essentially of nickel, cobalt, tantalum, or titanium. Additionally, an initiation layer comprising a metal or metal alloy selected from TaAlC is also very effective. These initiation layers catalyze the deposition of $TaC_x$. These initiation layers also allow deposition of $TaC_x$ to occur at temperatures below about 615° C., and as low as 450° C. Carrying out deposition at temperatures below 615° C. is greatly advantageous as integration becomes difficult at temperatures above 600° C. As such, TaAlC, and cobalt, tantalum, nickel and/or titanium discussed below, act as an initiation or nucleation layer, catalyzing the deposition of tantalum and titanium compounds.

Accordingly, one aspect of the invention relates to an initiation layer that comprises cobalt, tantalum, titanium or nickel. In a further embodiment, the initiation layer consists essentially of TaAlC, nickel, cobalt, tantalum, or titanium. The deposition of these elements is well known in the art. These metals can be deposited via known metal deposition methods including, but not limited to, chemical vapor deposition, atomic layer deposition, plasma vapor deposition, plasma enhanced atomic layer deposition, physical vapor deposition and related methods. Additionally, films consisting essentially of tantalum may be deposited by using plasma enhanced atomic layer deposition.

Another aspect of the invention relates to a method of depositing $TaC_x$ onto a substrate, the method comprising depositing an initiation layer comprising a metal or metal alloy selected from the group consisting of nickel, cobalt, tantalum, titanium and TaAlC onto a substrate; depositing a layer of $TaC_x$ onto the initiation layer, wherein x has a value having a range of about 0.4 to about 1.5. In one embodiment, the initiation layer consists essentially of TaAlC, nickel, cobalt, tantalum, or titanium. Any suitable substrate may be used. This includes, but is not limited to, $HfO_2$, $SiO_2$, TaN, TiN or combinations thereof. In one embodiment, the initiation layer may be deposited using plasma vapor deposition, chemical vapor deposition or atomic layer deposition. In some embodiments, the TaAlC, nickel, cobalt, tantalum or titanium is deposited using chemical vapor deposition or atomic layer deposition. In some embodiments, the initiation layer is cobalt or tantalum, and the cobalt or tantalum is deposited via plasma enhanced atomic layer deposition using a plasma comprising hydrogen.

This aspect of the invention also relates to a method of depositing $TaC_x$ onto a substrate, the method consisting essentially of depositing an initiation layer comprising a metal or metal alloy selected from the group consisting of nickel, cobalt, tantalum, titanium and TaAlC onto a substrate; depositing a layer of $TaC_x$ onto the initiation layer, wherein x has a value having a range of about 0.4 to about 1.5. In a further embodiment, the initiation layer consists essentially of TaAlC, nickel, cobalt, tantalum, or titanium.

As discussed above, it can be desirable to deposit metal onto a substrate at temperatures lower than about 600° C. to facilitate integration. Accordingly, one or more embodiments of the invention relates to depositing $TaC_x$ at temperatures of less than about 600° C.

During testing, it was found that a minimum of 10 Angstroms of cobalt can give consistent $TaC_x$ deposition. Accordingly, in one embodiment of the invention, the thickness of the initiation layer has a range of about 2 to about 20 Angstroms. In a more specific embodiment, the thickness of the initiation layer is at least about 10 Angstroms. In a yet more specific embodiment, the thickness of the initiation layer is about 10 Angstroms. However, the cobalt layer may be even bthinner if $TaC_x$ is deposited at higher temperatures.

Another aspect of the invention relates to a method of depositing $TaC_x$ onto a substrate, the method comprising: placing the substrate into a process chamber; depositing an initiation layer comprising a metal or metal alloy selected from the group consisting of TaAlC, nickel, cobalt, tantalum and titanium onto the substrate; and sequentially exposing the substrate containing the initiation layer to a $TaCl_5$ gas and a hydrocarbon gas to form a layer of $TaC_x$ on the initiation layer, wherein x has a range of about 0.4 to about 1.5. Where tantalum is used as the initiation layer, TaC may be deposited using the same chamber. In a further embodiment, the initiation layer consists essentially of TaAlC, nickel, cobalt, tantalum, or titanium. Thus, in a specific embodiment, the initiation layer comprises tantalum, and the layer of $TaC_x$ is deposited in the same process chamber as the initiation layer. Alternatively, if another metal is used, it may be desirable to deposit TaC in a different process chamber. Accordingly, in another embodiment, the method further comprising placing the substrate into a second process chamber before depositing a layer of $TaC_x$ onto the substrate. In yet another embodiment, the entire method is carried out at a temperature of less than about 600° C. In a further embodiment, only the deposition of $TaC_x$ is deposited at a temperature of less than about 600° C.

Another aspect of the invention relates to a method of depositing $TaC_x$ onto a substrate, the method consisting essentially of placing the substrate into a process chamber; depositing an initiation layer comprising a metal or metal alloy selected from the group consisting of TaAlC, nickel, cobalt, tantalum and titanium onto the substrate; and sequentially exposing the substrate containing the initiation layer to a $TaCl_5$ gas and a hydrocarbon gas to form a layer of $TaC_x$ on the initiation layer, wherein x has a value having a range of about 0.4 to about 1.5. In one or more embodiments, the initiation layer consists essentially of TaAlC, nickel, cobalt, tantalum, or titanium.

Yet another aspect of the invention relates to a method of depositing $TaC_x$ onto a substrate, the method comprising: depositing an initiation layer comprising a metal or metal alloy selected from the group consisting of TaAlC, nickel, cobalt, tantalum and titanium onto the substrate; sequentially exposing a surface of the substrate to a first reactant gas containing a tantalum halide and a second reactant gas comprising a hydrocarbon to form $TaC_x$ on the initiation layer, wherein x has a value having a range of about 0.4 to about 1.5; and repeating sequentially exposure of the substrate surface to the first reactant gas and second reactant gas. In some embodiments, the initiation layer consists essentially of TaAlC, nickel, cobalt, tantalum, or titanium. In one embodiment, the $TaC_x$ is deposited at a temperature of less than about 600° C. The substrate that is used includes, but is not limited to $HfO_2$, $SiO_2$, TaN, TiN or combinations thereof.

Another aspect of the invention relates to a method of depositing $TaC_x$ onto a substrate, the method consisting essentially of depositing an initiation layer comprising a metal or metal alloy selected from the group consisting of TaAlC, nickel, cobalt, tantalum and titanium onto the substrate; sequentially exposing a surface of the substrate to a first reactant gas containing a tantalum halide and a second reactant gas of the comprising a hydrocarbon form $TaC_x$ on the initiation layer, wherein x has a value having a range of about 0.4 to about 1.5; and repeating sequentially exposure of the substrate surface to the first reactant gas and second reactant gas.

In a specific embodiment, the initiation layer consists essentially of cobalt. In another embodiment, the initiation layer consists essentially of tantalum. In a related embodiment, a layer consisting essentially of cobalt can be deposited using chemical vapor deposition. In another embodiment, the tantalum is deposited using plasma enhanced atomic layer deposition. In a further embodiment, the plasma enhanced atomic layer deposition process uses a plasma comprising hydrogen.

As discussed, one option for deposition is use of a plasma comprising hydrogen. Variation in the ion energy of the incoming hydrogen species may be accomplished by varying the type of plasma (e.g., inductively-coupled plasma or capacitively coupled plasma) and/the frequency at which the plasma is generated. In applications that utilize capacitively coupled plasma, the hydrogen species typically has higher ion energy. When the higher energy hydrogen species in capacitively coupled plasma are utilized to treat a substrate, it has been found that the impact of the high energy hydrogen species on the surface of the substrate cause damage to the surface. Accordingly, methods described herein generally vary the ion energy by varying the frequency at which the plasma is generated. Recipe parameters such as pressure, flow and power can also be used to vary the energy of the incoming hydrogen species to tune selectivity between the ability of the hydrogen species to reduce the adsorbed metal precursor and cause damage to the underlying partially processed device wafer.

The methods of use of a plasma comprising hydrogen described herein may be incorporated into chemical vapor deposition (CVD) and/or atomic layer deposition (ALD) processes, using hardware typically associated with such processes. Accordingly, in one embodiment of the invention, cobalt may be deposited by chemical vapor deposition, followed by a hydrogen plasma treatment. The method may be used to selectively reduce a film deposition precursor that is adsorbed onto partially processed integrated circuit wafer to form metal layers thereon, without impacting the underlying layers in the partially processed wafer.

In one or more embodiments, the metal layers include tantalum, titanium and/or cobalt. The tantalum and/or titanium metal layers are typically deposited via ALD techniques using metal precursors such as metal halides, including tantalum fluoride ($TaF_5$), tantalum chloride ($TaCl_5$), titanium fluoride ($TiF_4$), and titanium chloride ($TiCl_4$). In use, a metal halide precursor flowed into a chamber and absorbed onto the surface of substrate, the deposited metal precursor layer is then treated with a plasma comprising hydrogen, which reduces the metal halide precursor to metal. The resulting byproducts of the reduction, i.e., HCl and/or HF, are volatile at processing conditions and are pumped out of the chamber. Cobalt metal layers are typically deposited via CVD techniques using a cobalt-metallo-organic precursor, such as, for example dicobalt hexacarbonyl tertiary butyl acetylene. In such embodiments, the hydrogen plasma is used to remove carbon or other organic components from the deposited layer.

The use of a plasma comprising hydrogen may include placing a substrate on a substrate support in a chamber of a reactor, depositing a metal precursor on the substrate and reducing the metal precursor to form a metal layer. Reducing the metal precursor to form a metal layer may be accomplished by various methods including exposing the metal layer to a plasma comprising hydrogen generated by alternating low and high frequencies, exposing the metal layer to a plasma comprising hydrogen having a dual low and high frequency, and/or exposing the metal layer to a plasma comprising hydrogen having a high frequency.

The tantalum metal layer may be formed, for example, by alternating a tantalum metal precursor layer deposition and hydrogen plasma treatment. Two hundred deposition/reduction cycles were performed, with each cycle lasting 10 seconds, yielding a deposition rate of 0.6/cycle. The hydrogen plasma reduction was performed at a power of 400 W using a frequency of 13.56 MHz. As used herein, "about 13.56 MHz" frequency refers to a frequency less than 15 MHz, for example in the range of about 10 MHz to less than 15 MHz. "About 40 MHz" refers to a frequency in the range of 30 MHz to 50 MHz. Typical reaction chambers that may be used to deposit metal layers on a substrate using hydrogen plasma may include a plasma reactor for supplying plasma to the chamber of the reactor.

Utilizing a dual frequency plasma treatment process provides the benefits of smoother wall coverage and preventing damage to the underlying layers in the partially processed wafer. As used herein, the term "dual frequency" refers to a plasma treatment process that includes alternating the high frequency-generated hydrogen plasma with a low frequency-generated hydrogen plasma or simultaneously using low frequency-generated and high frequency-generated hydrogen plasma.

As used herein, "low frequency" refers to a frequency of less than about 15 MHz, for example, in the range of about 1 MHz and 15 MHz, and "high frequency" refers to a frequency greater than about 20 MHZ, for example, in the range of 20 MHz to 60 MHz, and more specifically in the range of about 25 MHZ to 50 MHz. The low frequency may include a frequency of about 13.56 MHz and the high frequency may include a frequency of about 40 MHz. Thus, deposition using hydrogen plasma may include introducing a hydrogen gas into the chamber, supplying power to a power source operating at about 13.56 MHz frequency to generate a hydrogen plasma within a chamber for a first cycle and then supplying power to a power source operating at a about 40 MHz frequency to generate a hydrogen plasma within the chamber for a second cycle. The first and second cycles may be repeated with the first cycle occurring before the second cycle. In one or more embodiments, the same power source may be utilized or separate power sources may be utilized. The first cycle of supplying power to a power source operating at about 13.56 MHz frequency occurs after the second cycle and may be repeated.

This deposition method may include cyclical deposition and reduction of metal precursor layers. In one or more specific embodiments, the reduction step after each deposition step may include exposing the metal precursor layer to about 40 MHz frequency-generated hydrogen plasma for several cycles until an initial thickness of the resulting metal layer is formed. Thereafter, subsequent reduction steps after each subsequent deposition step may be performed using about 13.56 MHz frequency-generated hydrogen plasma.

In one or more embodiments, the method includes exposing the metal precursor layer to a hydrogen plasma having a dual low and high frequency includes introducing a hydrogen gas into the chamber, supplying power to a power source operating at a frequency of about 13.56 MHz to generate a hydrogen plasma within a chamber and simultaneously supplying power to a power source operating at a frequency of about 40 MHz to generate a hydrogen plasma within the chamber. In such embodiments, the power source operating at 13.56 MHz frequency is separate from the power source operating at about 40 MHz frequency.

In one or more embodiments, use of dual frequency plasma treatment as described above provides reduction or elimination in plasma damage while preventing any negative changes in resistivity. Moreover, the use of dual frequency-generated plasma enables metal deposition in other applications such as plasma enhanced atomic layer deposition (PEALD), used in the formation of metal gate applications, or other applications in which the underlying layers should not be exposed to plasma species.

Tantalum metal layers may be formed from the treatment of tantalum metal precursor layers deposited via an ALD (atomic layer deposition) process with hydrogen plasma generated at frequencies of about 13.56 MHz and about 40 MHz. Tantalum can be formed using the following process recipe:
1) a $TaF_5$ gas was flowed into a chamber containing a substrate for 5 seconds;
2) the chamber was purged for 5 seconds;
3) the chamber was vacuum pumped for 10 seconds;
4) the chamber and the substrate were allowed to stabilize for 5 seconds;
5) the substrate was treated with a hydrogen plasma for 10 seconds; and
6) the chamber was purged for 5 seconds.

Then the tantalum metal precursor layer may be treated with 13.56 MHz frequency-generated hydrogen plasma using a chamber pressure of 3.5 torr. Alternatively, it may be treated with about 40 MHz frequency-generated hydrogen plasma using a chamber pressure of 3.5 torr. It may also be treated with about 40 MHz frequency-generated hydrogen plasma using a chamber pressure of 1 torr.

In ALD or PEALD processes for depositing a tantalum metal layer, under the same processing conditions, treatment of a tantalum metal precursor layer with about 13.56 MHz frequency-generated hydrogen plasma results in a metal layer with better step coverage and possibly less roughness. However, such treatment has been found to cause damage to the underlying layers. In one or more embodiments, to address these issues, a tantalum metal layer may be formed by using deposition/reduction cycles to form a desired thickness of a tantalum metal layer. In one or more embodiments, the deposition/reduction cycles may include depositing some of the tantalum metal precursor layer on the substrate and treating it with a dual-frequency plasma to obtain a metal film without causing damage to the underlying film as achieved through the use of about 40 MHz frequency-generated hydrogen plasma, with improved roughness and step coverage that is achieved through the use of about 13.56 MHz frequency. The deposition/reduction cycle is repeated until a desired thickness of tantalum metal layer is achieved. This cyclical process may also be used to deposit other types of metal layers.

In one or more embodiments, dual frequency generated hydrogen plasma may also improve processing. For example, during tantalum metal deposition ALD processes, tantalum film may be deposited on the showerhead and/or the process kit, which are typically at a lower temperature than the substrate being processed. This deposited tantalum film may be very loose or may not stick to the surfaces of the processing chamber when a hydrogen plasma treatment using about 40 MHz frequency-generated hydrogen plasma is utilized and may fall onto a substrate processing or subsequent processing. The stickiness or the ability of the tantalum film to adhere to these surfaces is found to be improved with when a hydrogen plasma treatment using about 13.56 MHz frequency-generated hydrogen plasma is utilized. The difference in the stickiness of the resulting tantalum film deposited on the showerhead and other components of the chamber was determined by applying a piece of tape with an adhesive surface to the showerhead surface of a chamber used to perform hydrogen plasma treatment using about 40 MHz frequency-generated hydrogen plasma after 50 deposition processes. The tape utilized is available under the trademark Scotch® from 3M of Minneapolis, Minn. After application, the tape was then pulled off. Tantalum film was visibly seen to peel off from the showerhead. When the same tape was applied to the showerhead surface of a chamber used to perform hydrogen plasma treatment using about 13.56 MHz frequency-generated hydrogen plasma after 50 deposition processes, and pulled off, the tantalum film was not visible on the tape.

Accordingly, in one or more embodiments, to improve particle performance of the PEALD chamber used to deposit tantalum metal layers, hydrogen plasma treatment using a dual frequency-generated hydrogen plasma may be utilized to prevent damage to the underlying layer, while improving particle performance of the chamber. In one or more specific embodiments, hydrogen plasma treatment using about 13.56 MHz frequency-generated hydrogen plasma may be performed at the end of the deposition cycle at the end of a deposition/reduction cycle using about 40 MHz frequency-generated hydrogen plasma and/or when a substrate is not present in the chamber to improve adhesion of tantalum film deposited on the process kit and lid parts. Such low frequency plasma treatment may also be used after treatment of a metal precursor layer with only a high frequency-generated hydrogen plasma.

In one or more specific embodiments, exposing the metal precursor layer to a hydrogen plasma generated by a frequency of about 40 MHz is particularly useful in the deposition of cobalt metal layers using CVD. In such embodiments, the resulting metal layer has the same properties, including film resistivity, as cobalt metal layers formed from the treatment of cobalt metal precursor layers with about 13.56 MHz frequency-generated hydrogen plasma without causing the damage to the layers underlying the cobalt metal layer that is found after treatment with about 13.56 MHz frequency-generated hydrogen plasma.

Another aspect of the invention relates to an initiation layer comprising TaAlC. Deposition of TaAlC can be accomplished using precursors of $TaCl_5$ and triethyl aluminum (TEA). For example, a substrate is placed into a process chamber. Then, $TaCl_5$ is flowed into the chamber so that it reacts with the substrate. The chamber is then purged. After this step, TEA is flowed into the chamber. The chamber is then purged again.

$TaC_x$ may also be deposited via atomic layer deposition using $TaCl_5$ and a carbon source gas as precursors. The carbon source gas may comprise either at least one double or triple bond and may range from $C_1$ to $C_6$. One example of a carbon source gas suitable for the deposition of $TaC_x$ comprises ethylene. As such, in one embodiment of $TaC_x$ is deposited via atomic layer deposition by sequentially exposing the substrate to $TaCl_5$ gas and a hydrocarbon gas. In a specific embodiment, the hydrocarbon gas comprises at least one double bond or at least one triple bond. In a further embodiment, the hydrocarbon gas used comprises ethylene.

Deposition methods and cycles, where not specifically delineated, can be selected according to the knowledge of those having ordinary skill in the art. For example, as discussed above, in some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required. Indeed, other embodiments relate to deposition processes under very mild conditions without a plasma.

According to one or more embodiments, the substrate can be subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD) chambers, atomic layer deposition (ALD) chambers, chemical vapor deposition (CVD) chambers, physical vapor deposition (PVD) chambers, etch chambers, pre-clean chambers, chemical clean chambers, thermal treatment chambers such as RTP, plasma nitridation, degas, orientation, hydroxylation and other substrate processing chambers. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

EXAMPLES

Example 1 (Comparative)

An attempt was made to deposit $TaC_x$ via atomic layer deposition using $TaCl_5$ and ethylene precursors. Various temperatures and substrates were used. There was no deposition on $HfO_2$, $SiO_2$, MOCVD TiN, $TiCl_4$-based TiN, TaN substrates at temperatures of up to 615° C.

Example 2

$TaC_x$ was successfully deposited onto an initiation layer comprising a metal or metal alloy cobalt that was deposited via chemical vapor deposition. $TaC_x$ was also successfully deposited onto an initiation layer comprising tantalum deposited via plasma enhanced atomic layer deposition. Furthermore, $TaC_x$ was successfully deposited onto an initiation layer comprising TaAlC.

Example 3

Figure 2:
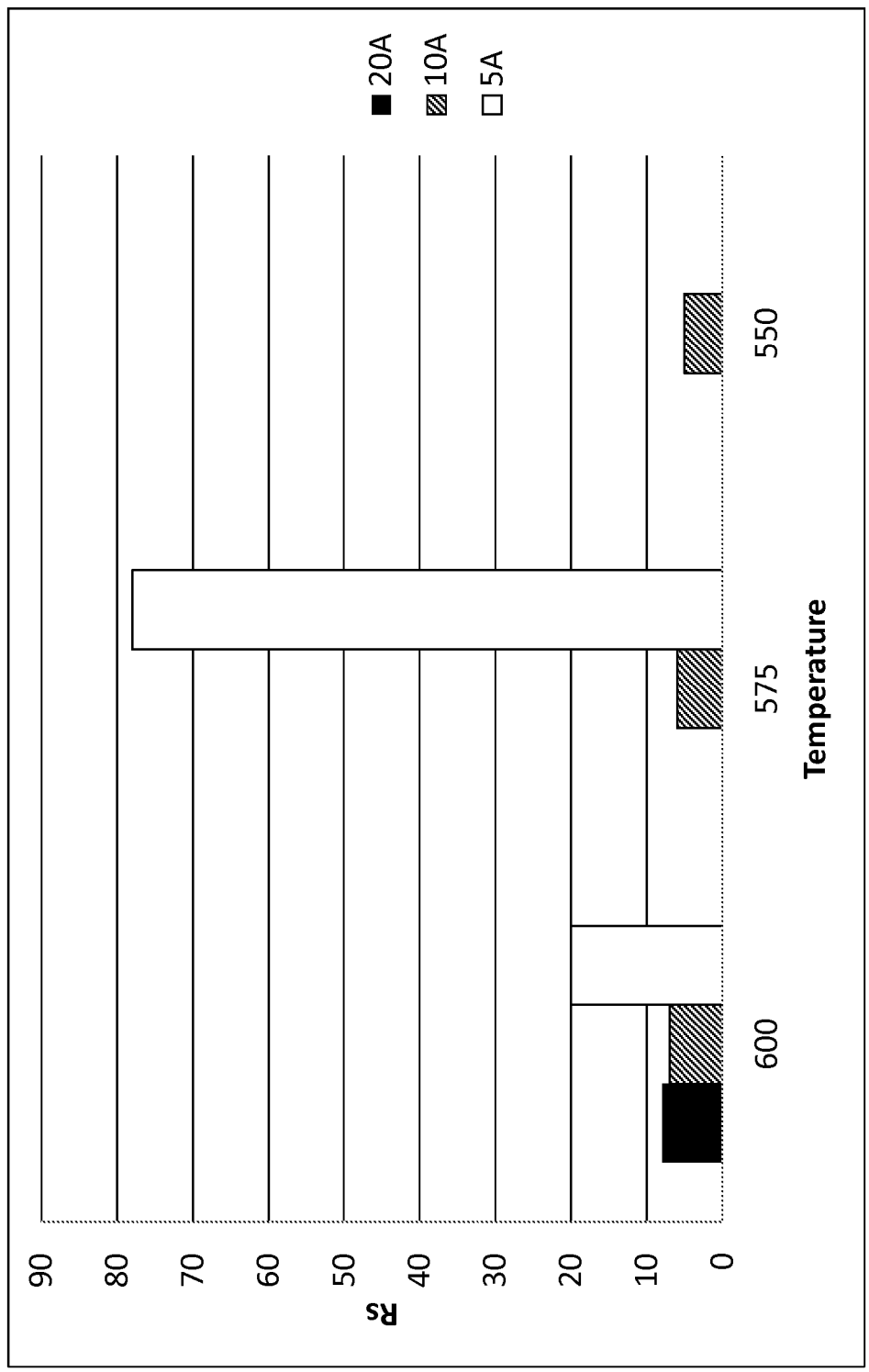
FIG. 2 is a graph showing the $R_s$ NU % across a cobalt initiation layer of 5, 10 and 20 Angstroms each at temperatures of 600°, 575° and 550° C.

The effect of cobalt thickness on 10 Angstroms of TaN and 1000 Angstroms of $SiO_2$ was explored. FIG. 1 is a graphical representation of the resistivity across a cobalt initiation layer of 5, 10 and 20 Angstroms each at temperatures of 600, 575 and 550° C. FIG. 2 is a graphical representation of the $R_s$ NU % across a cobalt initiation layer of 5, 10 and 20 Angstroms each at temperatures of 600, 575 and 550° C. From this, it was determined that at least 10 Angstroms of cobalt produces the most desirable results. At 5 Angstroms, a higher temperature is needed to obtain desired resistivity.

Example 4

Figure 3:
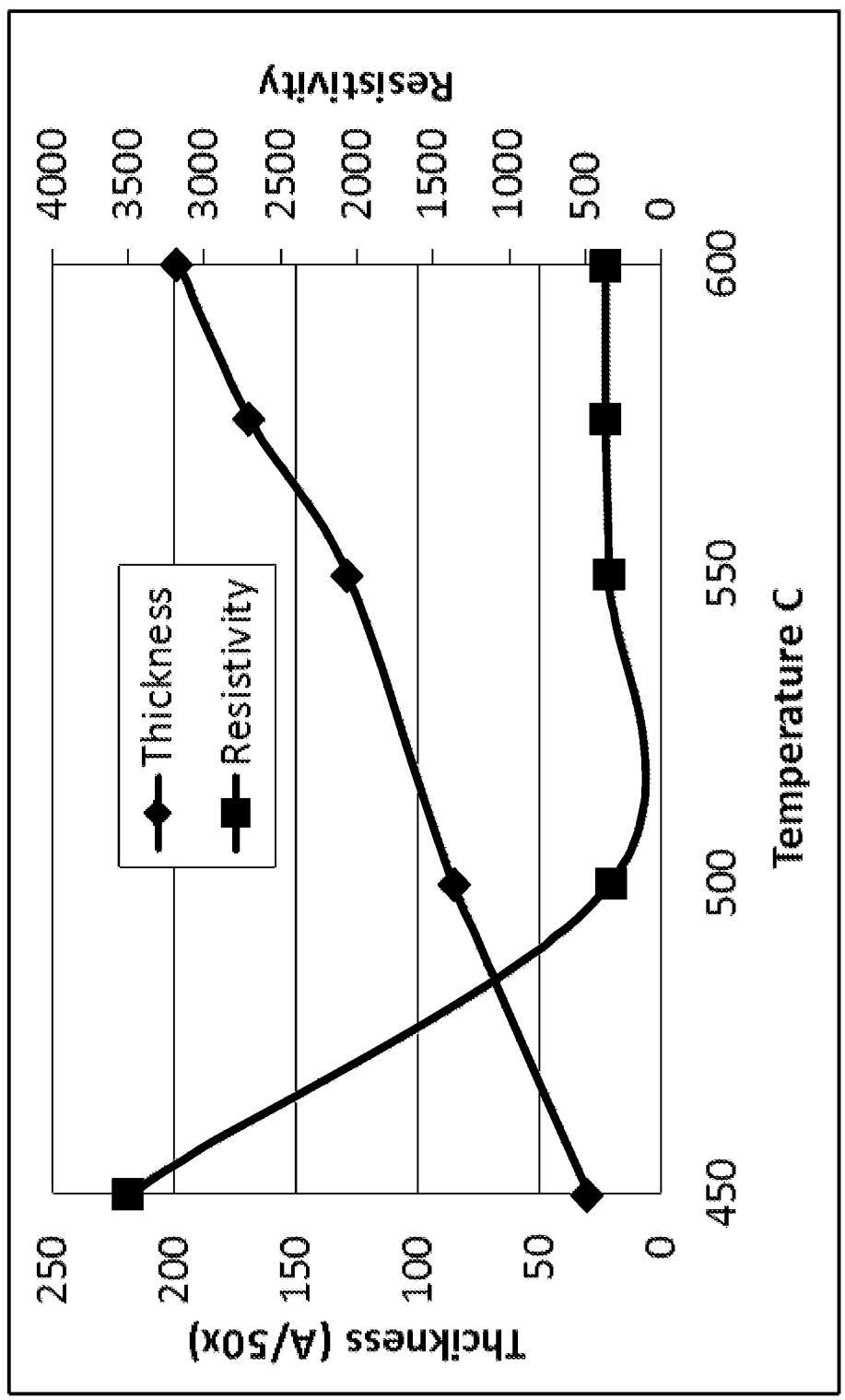
FIG. 3 is a graph showing $TaC_x$ thickness and resistivity versus temperature.

The temperature effect and resistivity of 10 Angstroms of cobalt on 10 Angstroms TaN/1000 Angstroms $SiO_2$ was studied. FIG. 3 is a graphical representation of $TaC_x$ thickness and resistivity versus temperature. Several sheet resistance maps of the resistivity were created pertaining to 10 Angstroms of cobalt/10 Angstroms TaN on 1000 Angstroms of $SiO_2$, and correspond to the resistivity data points on FIG. 3 for 500° C., 550° C., 575° C. and 600° C. These maps were created by measuring a number of locations on the substrate. Resistivity was determined to be about 350-400 ohms/sq.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing $TaC_x$ onto a substrate, the method comprising:
    depositing an initiation layer comprising TaAlC onto a substrate; and
    depositing a layer of $TaC_x$ onto the initiation layer, wherein x has a value having a range of about 0.4 to about 1.5.

2. The method of claim 1, wherein the initiation layer is deposited using plasma vapor deposition, plasma enhanced atomic layer deposition, chemical vapor deposition, atomic layer deposition or physical vapor deposition.

3. The method of claim 2, wherein the initiation layer consists essentially of TaAlC.

4. The method of claim 3, wherein the initiation layer is deposited via plasma enhanced atomic layer deposition using a plasma comprising hydrogen.

5. The method of claim 1, wherein the initiation layer has a thickness ranging from about 2 to about 20 Angstroms.

6. The method of claim 5, wherein the thickness of the initiation layer is about 10 Angstroms.

7. The method of claim 1, wherein the layer of $TaC_x$ is deposited via atomic layer deposition by sequentially exposing the substrate to $TaCl_5$ gas and a hydrocarbon gas.

8. The method of claim 7, wherein the hydrocarbon comprises a double or triple bond.

9. The method of claim 8, wherein the hydrocarbon comprises ethylene.

10. The method of claim 1, wherein the substrate comprises $HfO_2$, $SiO_2$, TaN, TiN or combinations thereof.

11. The method of claim 1, wherein depositing the layer of $TaC_x$ occurs at a temperature of less than about 600° C.

12. A method of depositing $TaC_x$ onto a substrate, the method comprising:
    placing the substrate into a process chamber;
    depositing an initiation layer consisting essentially of a metal or metal alloy selected from the group consisting of TaAlC and cobalt onto at least a portion of the substrate; and
    sequentially exposing a surface of the substrate containing the initiation layer to a $TaCl_5$ gas and a hydrocarbon gas to form a layer of $TaC_x$ on the initiation layer, wherein x has a value having a range of about 0.4 to about 1.5.

13. The method of claim 12, wherein the initiation layer consists essentially of TaAlC, and the layer of $TaC_x$ is deposited in the same process chamber as the initiation layer.

14. The method of claim 12, further comprising placing the substrate into a second process chamber before depositing the layer of $TaC_x$ onto the substrate.

15. The method of claim 12, wherein the entire method is carried out at a temperature of less than about 600° C.

16. A method of depositing $TaC_x$ onto a substrate, the method comprising:
    depositing an initiation layer consisting essentially of a metal or metal alloy selected from the group consisting of TaAlC and cobalt onto the substrate;
    sequentially exposing a surface of the substrate to a first reactant gas containing a tantalum halide and a second reactant gas comprising a hydrocarbon to form $TaC_x$ on the initiation layer, wherein x has a value having a range of about 0.4 to about 1.5; and
    sequentially repeating exposure of the substrate surface to the first reactant gas and second reactant gas.

17. The method of claim 16, wherein the $TaC_x$ is deposited at a temperature of less than about 600° C.

18. The method of claim 16, wherein the substrate comprises $HfO_2$, $SiO_2$, TaN, TiN or combinations thereof.

19. The method of claim 18, wherein the initiation layer is cobalt.

20. The method of claim 19, wherein the cobalt is deposited using plasma enhanced atomic layer deposition.

* * * * *